US012785626B2

(12) United States Patent
Liu et al.

(10) Patent No.: US 12,785,626 B2
(45) Date of Patent: Nov. 3, 2026

(54) POWER AMPLIFIER AND COMMUNICATION BASE STATION

(71) Applicant: ZTE CORPORATION, Shenzhen (CN)

(72) Inventors: Dikai Liu, Shenzhen (CN); Rong Shi, Shenzhen (CN); Pengjun Li, Shenzhen (CN); Lindong Song, Shenzhen (CN); Dong Wei, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 476 days.

(21) Appl. No.: 18/559,793

(22) PCT Filed: Apr. 28, 2022

(86) PCT No.: PCT/CN2022/090026
§ 371 (c)(1),
(2) Date: Nov. 9, 2023

(87) PCT Pub. No.: WO2022/237567
PCT Pub. Date: Nov. 17, 2022

(65) Prior Publication Data

US 2024/0235483 A1 Jul. 11, 2024

(30) Foreign Application Priority Data

May 13, 2021 (CN) ......................... 202110524376.2

(51) Int. Cl.

| | |
|---|---|
| ***H03F 1/02*** | (2006.01) |
| ***H03F 3/24*** | (2006.01) |
| ***H04B 1/04*** | (2006.01) |

(52) U.S. Cl.
CPC ........... *H03F 1/0222* (2013.01); *H03F 3/245* (2013.01); *H04B 1/0458* (2013.01); *H03F 2200/451* (2013.01); *H04B 2001/0408* (2013.01)

(58) Field of Classification Search
CPC .. H03F 1/0222; H03F 3/245; H03F 2200/451; H03F 1/0288; H03F 3/19;
(Continued)

(56) References Cited

U.S. PATENT DOCUMENTS

| | | | | |
|---|---|---|---|---|
| 8,957,734 | B2 * | 2/2015 | Ahmed .................. | H03F 3/211 330/124 R |
| 9,647,611 | B1 * | 5/2017 | Embar .................. | H03F 1/0288 |
| 2017/0272037 | A1 | 9/2017 | De Vreede et al. | |

FOREIGN PATENT DOCUMENTS

| | | | |
|---|---|---|---|
| CN | 101527545 | A | 9/2009 |
| CN | 102158176 | A | 8/2011 |

(Continued)

OTHER PUBLICATIONS

EESR of the corresponding EP Patent Application No. 22806535.5 dated Sep. 18, 2024.

(Continued)

*Primary Examiner* — Jessica Han
*Assistant Examiner* — Natasha Y Marano
(74) *Attorney, Agent, or Firm* — NZ Carr Law Office

(57) ABSTRACT

Disclosed are a power amplifier, comprising a main power amplifier unit, an auxiliary power amplifier unit, an envelope acquisition unit and a power control unit, wherein input ends of both the main power amplifier unit and the auxiliary power amplifier unit are connected to an electrical signal, and output ends of the two are coupled to each other; the power control unit comprises a first power control assembly and/or a second power control assembly, at least one main
(Continued)

power amplifier unit is connected to the electrical signal through the first power control assembly, and a control end of the first power control assembly is connected to the envelope acquisition unit; and at least one auxiliary power amplifier unit is connected to the electrical signal through the second power control assembly, and a control end of the second power control assembly is connected to the envelope acquisition unit.

15 Claims, 4 Drawing Sheets

(58) Field of Classification Search
CPC ........ H03F 2200/102; H03F 3/20; H03F 1/07; H04B 1/0458; H04B 2001/0408; Y02D 30/70; H04W 88/08
USPC ............................ 330/136, 124 R, 107, 295
See application file for complete search history.

(56) References Cited

FOREIGN PATENT DOCUMENTS

| | | | |
|---|---|---|---|
| CN | 111049480 | A | 4/2020 |
| CN | 111654243 | A | 9/2020 |
| EP | 2579457 | B1 | 11/2014 |
| JP | 2003536313 | A | 12/2003 |
| JP | 2016171500 | A | 9/2016 |

OTHER PUBLICATIONS (ISA/237) Written Opinion of the International Searching Authority dated Jul. 4, 2022.

The international search report of the corresponding PCT Application No. PCT/CN2022/090026 mailed on Jul. 4, 2022 along with English translation thereof.

* cited by examiner

POWER AMPLIFIER AND COMMUNICATION BASE STATION

CROSS REFERENCE TO RELATED APPLICATIONS

This application is a national stage filing under 35 U.S.C. § 371 of international application number PCT/CN2022/090026, filed on Apr. 28, 2022, which claims priority to Chinese patent application No. 202110524376.2, filed on May 13, 2021. The contents of these applications are incorporated herein by reference in their entirety.

TECHNICAL FIELD

Embodiments of the present application relate to the technical field of electronics, in particular to a power amplifier and a communication base station.

BACKGROUND

The energy conservation and consumption reduction of communication base stations have always been an important indicator of concern for telecommunications operators. As a main power consumption unit of base stations, the improvement of working efficiency of power amplifiers has always been a concern of research and development. Therefore, how to further improve the working efficiency of the power amplifiers is an urgent problem that needs to be solved.

SUMMARY

An embodiment of the present application provides a power amplifier, including: a main power amplifier unit, an auxiliary power amplifier unit, an envelope acquisition unit and a power control unit. An input end of the main power amplifier unit and an input end of the auxiliary power amplifier unit are connected to an electrical signal, and an output end of the main power amplifier unit is coupled to an output end of the auxiliary power amplifier unit, so as to perform power amplification on the electrical signal; the power control unit includes a first power control assembly, at least one main power amplifier unit is connected to the electrical signal through the first power control assembly, and a control end of the first power control assembly is connected to the envelope acquisition unit; and/or the power control unit includes a second power control assembly, at least one auxiliary power amplifier unit is connected to the electrical signal through the second power control assembly, and a control end of the second power control assembly is connected to the envelope acquisition unit.

An embodiment of the present application further provides a communication base station, including the power amplifier mentioned in the above embodiment.

BRIEF DESCRIPTION OF THE DRAWINGS

One or more embodiments are exemplified through figures in accompanying drawings corresponding to the embodiments, and these exemplary descriptions do not constitute a limitation of the embodiments.

DETAILED DESCRIPTION

In order to make objectives, technical solutions and advantages of embodiments of the present application clearer, the embodiments of the present application will be described in detail below with reference to accompanying drawings. However, those ordinarily skilled in the art may understand that in the embodiments of the present application, many technical details are proposed to enable readers to better understand the present application. However, even without these technical details and various changes and modifications based on the following embodiments, the technical solutions claimed by the present application may still be realized. The division of the following embodiments is for convenience in description and should not constitute any limitations to specific implementations of the present application, and all the embodiments may be combined with and referred to one another without contradiction.

In the description disclosed in the present application, it needs to be understood that terms "first", "second" and the like are only used to describe the objectives, and cannot be understood as indicating or implying relative importance. In addition, in the description disclosed in the present application, unless otherwise specified, "a plurality of" means two or more.

Figure 1:
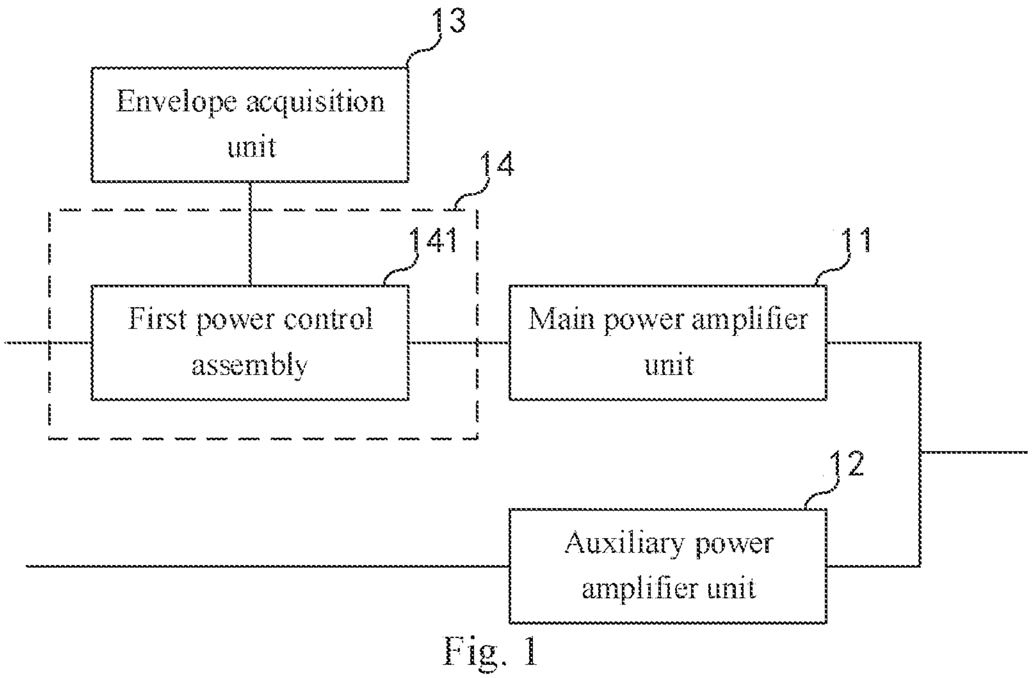
FIG. 1 is a schematic structural diagram of a first power amplifier according to an embodiment of the present application.

In one embodiment of the present application, as shown in FIG. 1, a power amplifier includes: a main power amplifier unit 11, an auxiliary power amplifier unit 12, an envelope acquisition unit 13 and a power control unit 14; an input end of the main power amplifier unit 11 and an input end of the auxiliary power amplifier unit 12 are connected to an electrical signal, and an output end of the main power amplifier unit 11 is coupled to an output end of the auxiliary power amplifier unit 12, so as to perform power amplification on the electrical signal; and the power control unit 14 includes a first power control assembly 141, at least one main power amplifier unit 11 is connected to the electrical signal through the first power control assembly 141, and a control end of the first power control assembly 141 is connected to the envelope acquisition unit 13.

Figure 2:
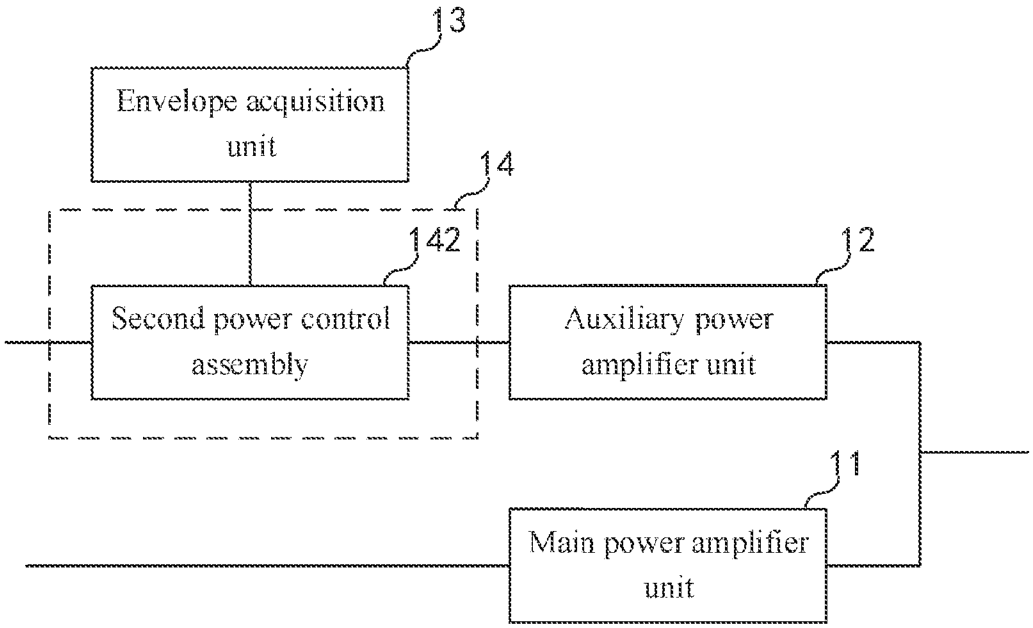
FIG. 2 is a schematic structural diagram of a second power amplifier according to an embodiment of the present application.

In another embodiment of the present application, as shown in FIG. 2, a power amplifier includes: a main power amplifier unit 11, an auxiliary power amplifier unit 12, an envelope acquisition unit 13 and a power control unit 14; an input end of the main power amplifier unit 11 and an input end of the auxiliary power amplifier unit 12 are connected to an electrical signal, and an output end of the main power amplifier unit 11 is coupled to an output end of the auxiliary power amplifier unit 12, so as to perform power amplification on the electrical signal; and the power control unit 14 includes a second power control assembly 142, at least one auxiliary power amplifier unit 12 is connected to the electrical signal through the second power control assembly 142, and a control end of the second power control assembly 142 is connected to the envelope acquisition unit 13.

Figure 3:
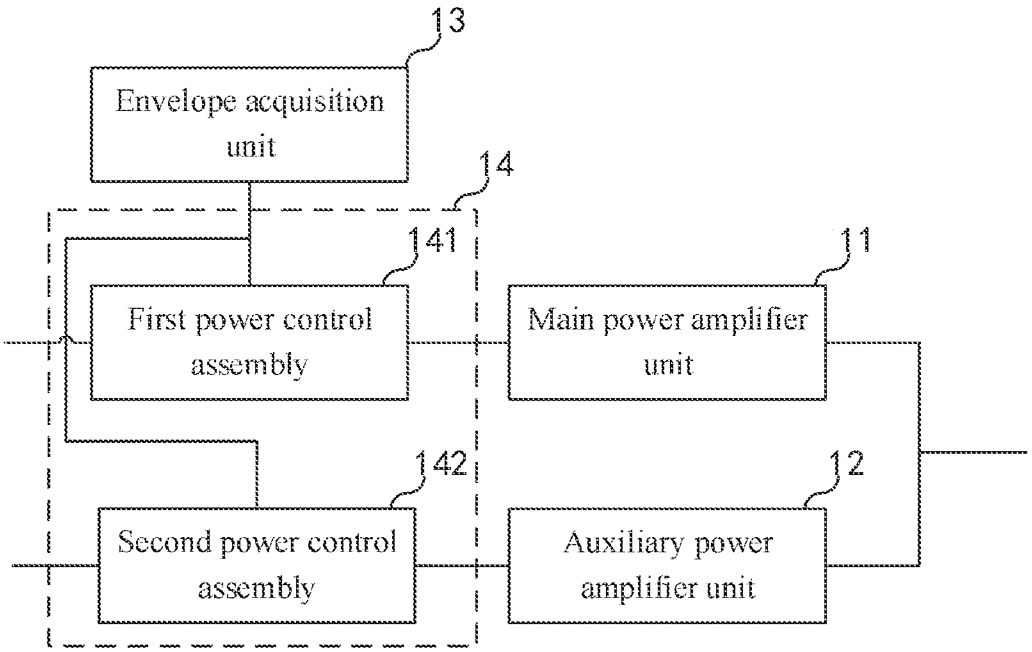
FIG. 3 is a schematic structural diagram of a third power amplifier according to an embodiment of the present application.

In yet another embodiment of the present application, as shown in FIG. 3, a power amplifier includes: a main power amplifier unit 11, an auxiliary power amplifier unit 12, an envelope acquisition unit 13 and a power control unit 14; an input end of the main power amplifier unit 11 and an input end of the auxiliary power amplifier unit 12 are connected to an electrical signal, and an output end of the main power amplifier unit 11 is coupled to an output end of the auxiliary power amplifier unit 12, so as to perform power amplification on the electrical signal; and the power control unit 14 includes a first power control assembly 141 and a second power control assembly 142, at least one main power amplifier unit 11 is connected to the electrical signal through the first power control assembly 141, and a control end of the first power control assembly 141 and a control end of the second power control assembly 142 are connected to the envelope acquisition unit 13 respectively.

An embodiment of the present application further provides a communication base station, including the power amplifier mentioned in the above embodiments.

In the embodiments of the present application, the main power amplifier unit or the auxiliary power amplifier unit is connected to the electrical signal through the power control assembly, the power control assembly controls input power of the main power amplifier unit or the auxiliary power amplifier unit which is connected to the power control assembly based on an envelop voltage of the electrical signal detected by the envelope acquisition unit, so that the input power of the main power amplifier unit or the auxiliary power amplifier unit can be adjusted dynamically. Since the envelop voltage of the electrical signal can reflect instantaneous power of the electrical signal, the input power of the main power amplifier unit or the auxiliary power amplifier unit is adjusted dynamically according to the instantaneous power of the electrical signal, a split ratio of the input power of the main power amplifier unit and the auxiliary power amplifier unit is flexibly adjusted, distortion of the power amplifier is reduced, the linearity of the power amplifier is improved, thus a space for improving efficiency of power amplification is provided, and working efficiency of the power amplifier is higher.

It needs to be noted that those skilled in the art may understand that for clarity, in FIG. 1 to FIG. 3, a structure of the power amplifier is illustrated by taking an example that the power amplifier is provided with one main power amplifier unit and one auxiliary power amplifier unit, that is, the power amplifier is provided with one main circuit and one auxiliary circuit. In practical applications, the power amplifier may further be provided with a plurality of main power amplifier units and a plurality of auxiliary power amplifier units, which is not limited in this embodiment.

It needs to be noted that those skilled in the art may understand that when the power amplifier is provided with a plurality of main power amplifier units 11, a structure of each main power amplifier unit 11 may be the same or different, which is not limited in this embodiment.

It needs to be noted that those skilled in the art may understand that when the power amplifier is provided with a plurality of main power amplifier units 11, the power amplifier may be provided with one first power control assembly 141, and some or all of the main power amplifier units 11 are connected to the electrical signal through the first power control assembly 141. The power amplifier may also be provided with T first power control assemblies 141, the main power amplifier units 11 are divided into T groups, and each group of main power amplifier units 11 is connected to the electrical signal through the corresponding first power control assembly 141 of this group. The power amplifier may further be provided with one first power control assembly 141 on a branch where each main power amplifier unit 11 is located, and each main power amplifier unit 11 is connected to the electrical signal through each first power control assembly 141. The number and setting method of the first power control assembly 141 are not limited in this embodiment when the power amplifier is provided with a plurality of main power amplifier units 11.

It needs to be noted that those skilled in the art may understand that when the power amplifier is provided with a plurality of auxiliary power amplifier units 12, a structure of each auxiliary power amplifier unit 12 may be the same or different, which is not limited in this embodiment.

It needs to be noted that those skilled in the art may understand that when the power amplifier is provided with a plurality of auxiliary power amplifier units 12, the power amplifier may be provided with one second power control assembly 142, and some or all of the auxiliary power amplifier units 12 are connected to the electrical signal through the second power control assembly 142. The power amplifier may also be provided with M second power control assemblies 142, the auxiliary power amplifier units 12 are divided into M groups, and each group of auxiliary power amplifier units 12 is connected to the electrical signal through the corresponding second power control assembly 142 of this group. The power amplifier may further be provided with one second power control assembly 142 on a branch where each auxiliary power amplifier unit 12 is located, and each auxiliary power amplifier unit 12 is connected to the electrical signal through each second power control assembly 142. The number and setting method of the second power control assembly 142 are not limited in this embodiment when the power amplifier is provided with a plurality of auxiliary power amplifier units 12.

Figure 4:
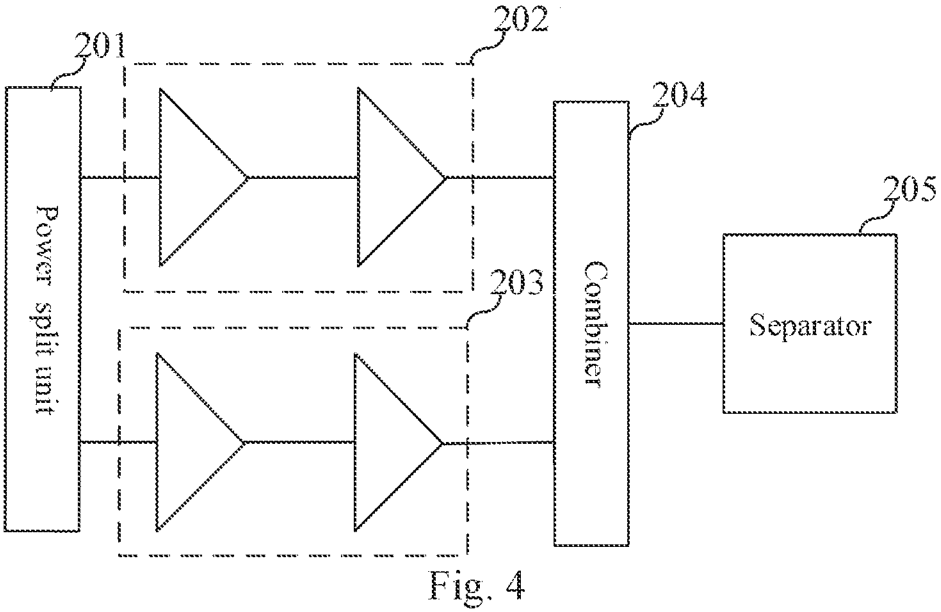
FIG. 4 is a schematic structural diagram of an existing power amplifier adopting a Doherty architecture.

Since signals transmitted by existing communication base stations have a certain peak-to-average ratio, power amplifiers of the existing communication base stations generally adopt Doherty architecture. The advantages of the Doherty architecture are that a better efficiency performance can be achieved within a large power back-off range, and a structure is simple. A schematic structural diagram of an existing power amplifier adopting the Doherty architecture is as shown in FIG. 4. The power amplifier includes: a power splitter 201, a main circuit 202, an auxiliary circuit 203, a combiner 204 and a separator 205. A working principle of the power amplifier with the Doherty architecture is: when instantaneous power of a signal is small, the auxiliary circuit (Peak circuit) is turned off, and the main circuit (Carrier circuit) works; and when the instantaneous power increases, the output of the main circuit approaches saturation, and the auxiliary circuit is turned on to further amplify the signal. However, the existing power amplifier with the Doherty architecture adopts the power splitter (Doherty spliter) with a fixed power split ratio, and the power split ratio provided by the power splitter remains unchanged as the instantaneous power of a radio-frequency input signal changes. The linearity and efficiency of power amplification are in a trade-off relationship, and the requirement for linearity indicators limits the further improvement of power amplification efficiency. Taking the power amplifier adopting the Doherty architecture and the electrical signal being a radio-frequency signal as an example, in the embodiments of the present application, a power control assembly is added in a branch where a main power amplifier unit 11 and/or an auxiliary power amplifier unit 12 are/is located to split the input power of the main power amplifier unit 11 and/or the auxiliary power amplifier unit 12 dynamically. When the instantaneous power of the radio-frequency signal is relatively small, power of the radio-frequency signal is mainly split to the main power amplifier unit 11, and when the instantaneous power of the radio-frequency signal is relatively large, the power of the radio-frequency signal is mainly split to the auxiliary power amplifier unit 12. The power amplifier adjusts the input power of the main power amplifier unit 11 and/or the auxiliary power amplifier unit 12 dynamically according to the instantaneous power of the electrical signal, and adjusts a split ratio of the input power of the main power amplifier unit 11 and the auxiliary power amplifier unit 12 flexibly, distortion of the power amplifier is reduced, the linearity of the power amplifier is improved, and thus a space for improving efficiency of power amplification is provided.

In one embodiment, an output end of the envelope acquisition unit 13 outputs an envelop voltage of the electrical signal, an output signal of the first power control assembly 141 is negatively correlated with an input signal of a control end of the first power control assembly 141, and an output signal of the second power control assembly 142 is positively correlated with an input signal of a control end of the second power control assembly 142. Specifically, when the input signal of the control end of the first power control assembly 141 decreases, the output signal of the first power control assembly 141 increases. When the input signal of the control end of the first power control assembly 141 increases, the output signal of the first power control assembly 141 decreases. When the input signal of the control end of the second power control assembly 142 decreases, the output signal of the second power control assembly 142 decreases. When the input signal of the control end of the second power control assembly 142 increases, the output signal of the second power control assembly 142 increases. The control ends of the first power control assembly 141 and the second power control assembly 142 are both connected to the output end of the envelope acquisition unit 13. When the envelop voltage acquired by the envelope acquisition unit 13 decreases, that is, the instantaneous power of the input electrical signal decreases, the output signal of the first power control assembly 141 increases, and the output signal of the second power control assembly 142 decreases, so that the electrical signal is mainly split to the main power amplifier unit 11. When the envelop voltage acquired by the envelope acquisition unit 13 increases, that is, the instantaneous power of the electrical signal increases, the output signal of the first power control assembly 141 decreases, and the output signal of the second power control assembly 142 increases, so that the electrical signal is mainly split to the auxiliary power amplifier unit 12.

In another embodiment, the output end of the envelope acquisition unit 13 outputs an inverse voltage of the envelop voltage of the electrical signal, the output signal of the first power control assembly 141 is positively correlated with the input signal of the control end of the first power control assembly 141, and the output signal of the second power control assembly 142 is negatively correlated with the input signal of the control end of the second power control assembly 142. Specifically, when the input signal of the control end of the first power control assembly 141 decreases, the output signal of the first power control assembly 141 decreases. When the input signal of the control end of the first power control assembly 141 increases, the output signal of the first power control assembly 141 increases. When the input signal of the control end of the second power control assembly 142 increases, the output signal of the second power control assembly 142 decreases. When the input signal of the control end of the second power control assembly 142 decreases, the output signal of the second power control assembly 142 increases. The control ends of the first power control assembly 141 and the second power control assembly 142 are both connected to the output end of the envelope acquisition unit 13. When the envelop voltage of the electrical signal decreases, the inverse voltage of the envelop voltage acquired by the envelop acquisition unit 13 increases, the output signal of the first power control assembly 141 increases, and the output signal of the second power control assembly 142 decreases, so that the electrical signal is mainly split to the main power amplifier unit 11. When the envelop voltage of the electrical signal increases, the inverse voltage of the envelop voltage acquired by the envelop acquisition unit 13 decreases, the output signal of the first power control assembly 141 decreases, and the output signal of the second power control assembly 142 increases, so that the electrical signal is mainly split to the auxiliary power amplifier unit 12.

In this embodiment, the envelop voltage of the electrical signal is used to control the first power control assembly 141 and/or the second power control assembly 142 to achieve dynamical distribution of the input power of the main power amplifier unit 11 and the auxiliary power amplifier unit 12, that is, when the envelop voltage of the electrical signal is small, the power of the electrical signal is mainly split to the main power amplifier unit 11; and when the envelop voltage of the electrical signal is large, the power of the electrical signal is mainly split to the auxiliary power amplifier unit 12. By flexibly configuring the split ratio of the instantaneous input power of the main power amplifier unit 11 and the auxiliary power amplifier unit 12, the working efficiency of the power amplifier is improved.

In another embodiment, if the power control unit 14 includes at least one first power control assembly 141 and at least one second power control assembly 142, an action speed of the first power control assembly 141 is different from an action speed of the second power control assembly 142. The action speed is an action response speed, that is, a self output speed changed based on a control signal of the control end. That is, the action speed of the first power control assembly 141 represents the output speed, changed by the first power control assembly 141 in response to change of the control end of the first power control assembly 141, of the first power control assembly 141. The action speed of the second power control assembly 142 represents the output speed, changed by the second power control assembly 142 in response to change of the control end of the second power control assembly 142, of the second power control assembly 142.

Specifically, since the action speed of the first power control assembly 141 is different from the action speed of the second power control assembly 142, when the instantaneous power of the electrical signal changes, the response speeds of the two are different, so that the power of the electrical signal split to the main power amplifier unit 11 which is connected to the first power control assembly 141 and the auxiliary power amplifier unit 12 which is connected to the second power control assembly 142 changes.

For example, the output of the first power control assembly is positively correlated with the input of the control end of the first power control assembly, the output of the second power control assembly is positively correlated with the input of the control end of the second power control assembly, and the action speed of the first power control assembly 141 is smaller than the action speed of the second power control assembly 142. When the instantaneous power of the electrical signal increases, the envelop voltage increases, and the input of the control end of the first power control assembly 141 and the control end of the second power control assembly 142 increases. Since the action speed of the second power control assembly 142 is higher, the output of the second power control assembly 142 increases firstly, so that the input power of the auxiliary power amplifier unit 12 is increased, and the power of the electrical signal is mainly split to the auxiliary power amplifier unit 12. When the instantaneous power of the electrical signal decreases, the envelop voltage decreases, and the input of the control end of the first power control assembly 141 and the control end of the second power control assembly 142 decreases. Since the action speed of the second power control assembly 142 is higher, the output of the second power control assembly 142 decreases firstly, so that the input power of the auxiliary power amplifier unit 12 decreases, and the power of the electrical signal is mainly split to the main power amplifier unit 11. By dynamically adjusting the power split ratio of the main power amplifier unit 11 and the auxiliary power amplifier unit 12, the working efficiency of the power amplifier is improved.

It needs to be noted that those skilled in the art may understand that in practical applications, other control mechanisms may further be set to adjust the setting methods of the first power control assembly and the second power control assembly, as long as the input power of each main power amplifier unit and each auxiliary power amplifier unit can be finally split dynamically based on the envelop voltage.

Optionally, the first power control assembly and/or second power control assembly at least include/includes a voltage variable attenuator.

It needs to be noted that those skilled in the art may understand that the first power control assembly and/or the second power control assembly may also adopt other circuit structures, which are not listed in this embodiment one by one.

In one embodiment, the power amplifier further includes: a power split unit 15, and the first power control assembly 141 and/or the second power control assembly 142 are/is connected to the electrical signal through the power split unit 15. The power split unit 15 divides the electrical signal connected to the input end into a plurality of electrical signals according to a preset power split ratio.

Figure 5:
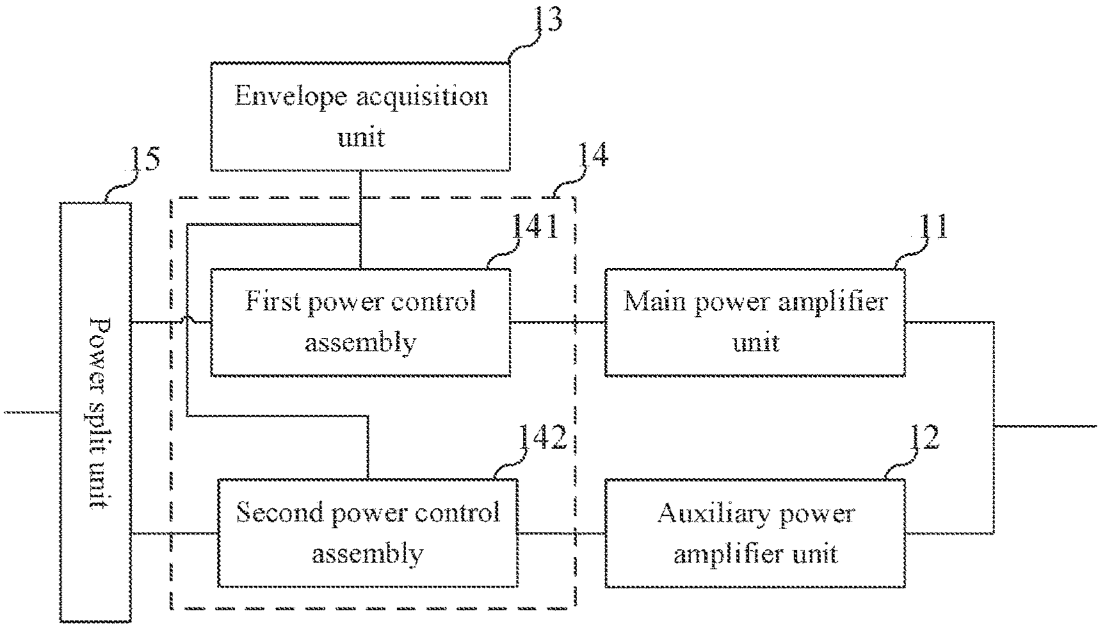
FIG. 5 is a schematic structural diagram of a power amplifier according to another embodiment of the present application.

Taking the power control unit 14 including at least one first power control assembly 141 and at least one second power control assembly 142 as an example, when the power amplifier further includes the power split unit 15, a schematic structural diagram of the power amplifier is as shown in FIG. 5. The electrical signal is connected to a branch where each main power amplifier unit 11 is located and a branch where each auxiliary power amplifier unit 12 is located respectively through the power split unit 15. Here, the electrical signal may be a radio-frequency signal of a communication base station, and may also be other signals.

Figure 6:
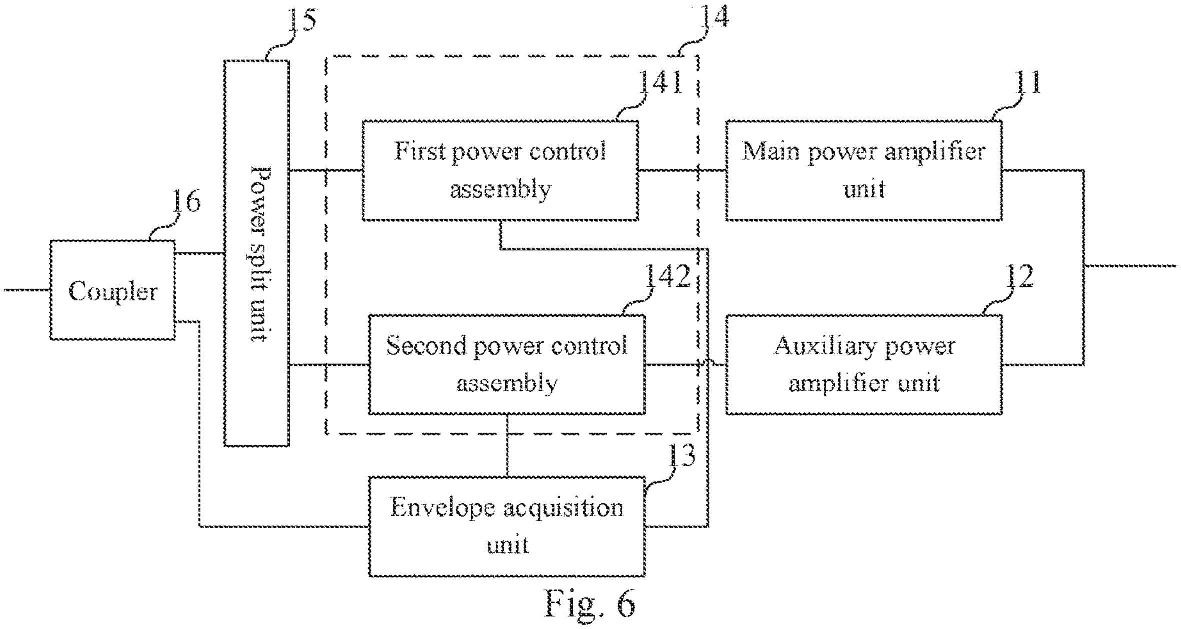
FIG. 6 is a schematic structural diagram of a power amplifier according to yet another embodiment of the present application.

Optionally, as shown in FIG. 6, the power amplifier further includes: a coupler 16; and an input end of the power split unit 15 and an input end of the envelope acquisition unit 13 are connected to the electrical signal through the coupler 16. Specifically, an input end of the coupler 16 is connected to the electrical signal, a first output end of the coupler 16 is connected to the input end of the power split unit 15, and a second output end of the coupler 16 is connected to the envelope acquisition unit 13.

In one embodiment, the power amplifier is applied to the communication base station, and the electrical signal is the radio-frequency signal. The power amplifier further includes: a conversion unit; and the envelope acquisition unit is connected to an intermediate frequency signal of the communication base station through the conversion unit, here, the radio-frequency signal is generated based on the intermediate frequency signal. Since the intermediate frequency signal in the communication base station approaches an envelop signal, the conversion unit may be set in the power amplifier to convert the intermediate frequency signal, and the envelop voltage is obtained based on a converted signal.

Optionally, the conversion unit may include an amplification assembly and an attenuation assembly which are connected in series. The amplification assembly amplifies the intermediate frequency signal, the attenuation assembly attenuates the amplified intermediate frequency signal, and the envelop voltage that can be used for the power amplifier is obtained based on the attenuated electrical signal.

It needs to be noted that those skilled in the art may understand that circuits of the amplification assembly and the attenuation assembly may be designed according to the intermediate frequency signal and working voltages of other units in the power amplifier, which is not limited in this embodiment.

In one embodiment, the envelope acquisition unit 13 includes an envelop tracker. The power amplifier detects the envelop voltage of the electrical signal through the envelop tracker.

It needs to be noted that those skilled in the art may understand that in this embodiment, the envelope acquisition unit 13 may further be in other circuit forms, as long as the circuit may further detect the envelop voltage, and the specific circuit form of the envelope acquisition unit 13 is not limited in this embodiment.

It needs to be noted that those skilled in the art may understand that in this embodiment, the envelop voltage may further be obtained through other forms besides circuit detection, which is not limited in this embodiment.

In one embodiment, the power control unit further includes: a third power control assembly, at least one main power amplifier unit is connected to the electrical signal through the first power control assembly and the third power control assembly, and a control end of the third power control assembly is connected to the envelope acquisition unit 13; and/or the power control unit further includes: a fourth power control assembly, at least one auxiliary power amplifier unit is connected to the electrical signal through the second power control assembly and the fourth power control assembly, and a control end of the fourth power control assembly is connected to the envelope acquisition unit 13. Specifically, a plurality of power control assemblies are cascaded, and a control degree and a control speed may be increased.

Optionally, if the output end of the envelope acquisition unit 13 outputs the envelop voltage of the electrical signal, the output of the third power control assembly is negatively correlated with the input of the control end of the third power control assembly, and the output of the fourth power control assembly is positively correlated with the input of the control end of the fourth power control assembly. If the output end of the envelope acquisition unit 13 outputs an inverse voltage of the envelop voltage of the electrical signal, an output signal of the third power control assembly is positively correlated with an input signal of the control end of the third power control assembly, and an output signal of the fourth power control assembly is negatively correlated with an input signal of the control end of the fourth power control assembly.

It needs to be noted that those skilled in the art may understand that circuit structures of the first power control assembly and the third power control assembly may be the same or different, which is not limited in this embodiment.

It needs to be noted that those skilled in the art may understand that circuit structures of the second power control assembly and the fourth power control assembly may be the same or different, which is not limited in this embodiment.

It needs to be noted that those skilled in the art may understand that the number of the power control assemblies which are connected in series on the branch where the main power amplifier unit and/or the auxiliary power amplifier unit are/is located may be set according to needs, which is not limited in this embodiment.

The above embodiments may be combined with and referred to each other, for example, the followings are examples of the combined embodiments, but they are not limited to this. All embodiments may be arbitrarily combined to form a new embodiment without contradiction.

Taking the power control unit 14 including at least one first power control assembly 141 and at least one second power control assembly 142 as an example, the new embodiments formed by combining all the embodiments are exemplified below. When the power control unit 14 includes at least one first power control assembly 141 or at least one second power control assembly 142, it may refer to the relevant content of the following embodiments, which is not listed here one by one. The relevant content of the following embodiments may refer to the relevant descriptions in the previous text, which will not be repeated here.

Figure 7:
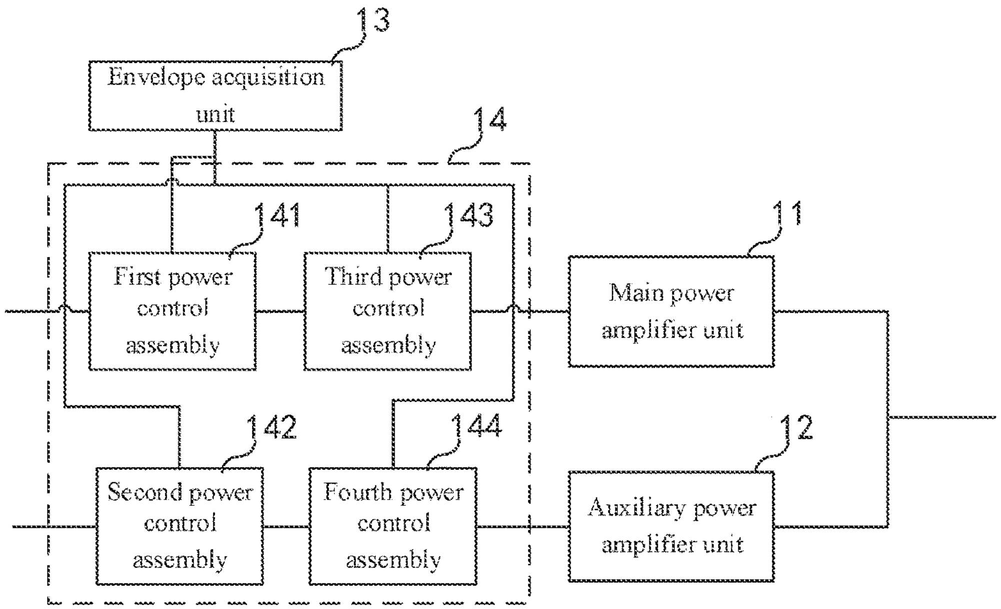
FIG. 7 is a schematic structural diagram of a power amplifier according to yet another embodiment of the present application.

In one embodiment, as shown in FIG. 7, the power amplifier includes: a main power amplifier unit 11, an auxiliary power amplifier unit 12, an envelope acquisition unit 13 and a power control unit 14; an input end of the main power amplifier unit 11 and an input end of the auxiliary power amplifier unit 12 are connected to an electrical signal, and an output end of the main power amplifier unit 11 is coupled to an output end of the auxiliary power amplifier unit 12, so as to perform power amplification on the electrical signal; and the power control unit 14 includes a first power control assembly 141, a second power control assembly 142, a third power control assembly 143 and a fourth power control assembly 144, at least one main power amplifier unit 11 is connected to the electrical signal through the first power control assembly 141 and the third power control assembly 143, at least one auxiliary power amplifier unit 12 is connected to the electrical signal through the second power control assembly 142 and the fourth power control assembly 144, and a control end of the first power control assembly 141, a control end of the second power control assembly 142, a control end of the third power control assembly 143 and a control end of the fourth power control assembly 144 are connected to the envelope acquisition unit 13 respectively. If an output end of the envelope acquisition unit 13 outputs an envelop voltage of the electrical signal, the output of the first power control assembly 141 is negatively correlated with the input of the control end of the first power control assembly 141, the output of the second power control assembly 142 is positively correlated with the input of the control end of the second power control assembly 142, the output of the third power control assembly 143 is negatively correlated with the input of the control end of the third power control assembly 143, and the output of the fourth power control assembly 144 is positively correlated with the input of the control end of the fourth power control assembly 144. If the output end of the envelope acquisition unit 13 outputs the envelop voltage of the electrical signal, the output of the first power control assembly 141 is positively correlated with the input of the control end of the first power control assembly 141, the output of the second power control assembly 142 is negatively correlated with the input of the control end of the second power control assembly 142, the output of the third power control assembly 143 is positively correlated with the input of the control end of the third power control assembly 143, and the output of the fourth power control assembly 144 is negatively correlated with the input of the control end of the fourth power control assembly 144.

Optionally, the first power control assembly 141, the second power control assembly 142, the third power control assembly 143 and the fourth power control assembly 144 at least include a voltage variable attenuator.

Optionally, the envelope acquisition unit 13 includes an envelop tracker.

In one embodiment, a power amplifier includes: a main power amplifier unit 11, an auxiliary power amplifier unit 12, an envelope acquisition unit 13 and a power control unit 14; an input end of the main power amplifier unit 11 and an input end of the auxiliary power amplifier unit 12 are connected to an electrical signal, and an output end of the main power amplifier unit 11 is coupled to an output end of the auxiliary power amplifier unit 12, so as to perform power amplification on the electrical signal; and the power control unit 14 includes a first power control assembly 141, a second power control assembly 142, a third power control assembly 143 and a fourth power control assembly 144, at least one main power amplifier unit 11 is connected to the electrical signal through the first power control assembly 141 and the third power control assembly 143, at least one auxiliary power amplifier unit 12 is connected to the electrical signal through the second power control assembly 142 and the fourth power control assembly 144, and a control end of the first power control assembly 141, a control end of the second power control assembly 142, a control end of the third power control assembly 143 and a control end of the fourth power control assembly 144 are connected to the envelope acquisition unit 13 respectively. An action speed of the first power control assembly 141 is different from an action speed of the second power control assembly 142, and an action speed of the third power control assembly 143 is different from an action speed of the fourth power control assembly 144. Specifically, the action speeds of the first power control assembly 141 and the third power control assembly 143 are both smaller than the action speeds of the second power control assembly 142 and the fourth power control assembly 144, or the action speeds of the first power control assembly 141 and the third power control assembly 143 are both greater than the action speeds of the second power control assembly 142 and the fourth power control assembly 144.

Optionally, the first power control assembly 141, the second power control assembly 142, the third power control assembly 143 and the fourth power control assembly 144 at least include a voltage variable attenuator.

Optionally, the envelope acquisition unit 13 includes an envelop tracker.

In one embodiment, a power amplifier includes: a main power amplifier unit 11, an auxiliary power amplifier unit 12, an envelope acquisition unit 13, a power control unit 14 and a power split unit 15; an input end of the main power amplifier unit 11 and an input end of the auxiliary power amplifier unit 12 are connected to an electrical signal, an output end of the main power amplifier unit 11 is coupled to an output end of the auxiliary power amplifier unit 12, and an output end of the envelope acquisition unit 13 is connected to a control end of the power control unit 14; and the power control unit 14 includes a first power control assembly 141, and a second power control assembly 142, at least one main power amplifier unit 11 is connected to the electrical signal through the first power control assembly 141, at least one auxiliary power amplifier unit 12 is connected to the electrical signal through the second power control assembly 142, and a control end of the first power control assembly 141 and a control end of the second power control assembly 142 are connected to the envelope acquisition unit 13 respectively. The first power control assembly 141 and the second power control assembly 142 are connected to the electrical signal through the power split unit 15. If an output end of the envelope acquisition unit 13 outputs an envelop voltage of the electrical signal, the output of the first power control assembly 141 is negatively correlated with the input of the control end of the first power control assembly 141, and the output of the second power control assembly 142 is positively correlated with the input of the control end of the second power control assembly 142. If the output end of the envelope acquisition unit 13 outputs the envelop voltage of the electrical signal, the output of the first power control assembly 141 is positively correlated with the input of the control end of the first power control assembly 141, and the output of the second power control assembly 142 is negatively correlated with the input of the control end of the second power control assembly 142.

Optionally, the first power control assembly and second power control assembly at least include a voltage variable attenuator.

Optionally, the power amplifier further includes: a coupler 16; and an input end of the power split unit 15 and an input end of the envelope acquisition unit 13 are connected to the electrical signal through the coupler 16.

Optionally, the envelope acquisition unit 13 includes an envelop tracker.

In one embodiment, a power amplifier includes: a main power amplifier unit 11, an auxiliary power amplifier unit 12, an envelope acquisition unit 13, a power control unit 14 and a power split unit 15; an input end of the main power amplifier unit 11 and an input end of the auxiliary power amplifier unit 12 are connected to an electrical signal, and an output end of the main power amplifier unit 11 is coupled to an output end of the auxiliary power amplifier unit 12, so as to perform power amplification on the electrical signal; and the power control unit 14 includes a first power control assembly 141 and a second power control assembly 142, at least one main power amplifier unit 11 is connected to the electrical signal through the first power control assembly 141, at least one auxiliary power amplifier unit 12 is connected to the electrical signal through the second power control assembly 142, and a control end of the first power control assembly 141 and a control end of the second power control assembly 142 are connected to the envelope acquisition unit 13 respectively. The first power control assembly 141 and the second power control assembly 142 are connected to the electrical signal through the power split unit 15. An action speed of the first power control assembly 141 is different from an action speed of the second power control assembly 142. Specifically, the action speed of the first power control assembly 141 is smaller than the action speed of the second power control assembly 142, or the action speed of the first power control assembly 141 is greater than the action speed of the second power control assembly 142.

Optionally, the first power control assembly 141 and the second power control assembly 142 at least include a voltage variable attenuator.

Optionally, the power amplifier further includes: a coupler 16; and an input end of the power split unit 15 and an input end of the envelope acquisition unit 13 are connected to the electrical signal through the coupler 16.

Optionally, the envelope acquisition unit 13 includes an envelop tracker.

Figure 8:
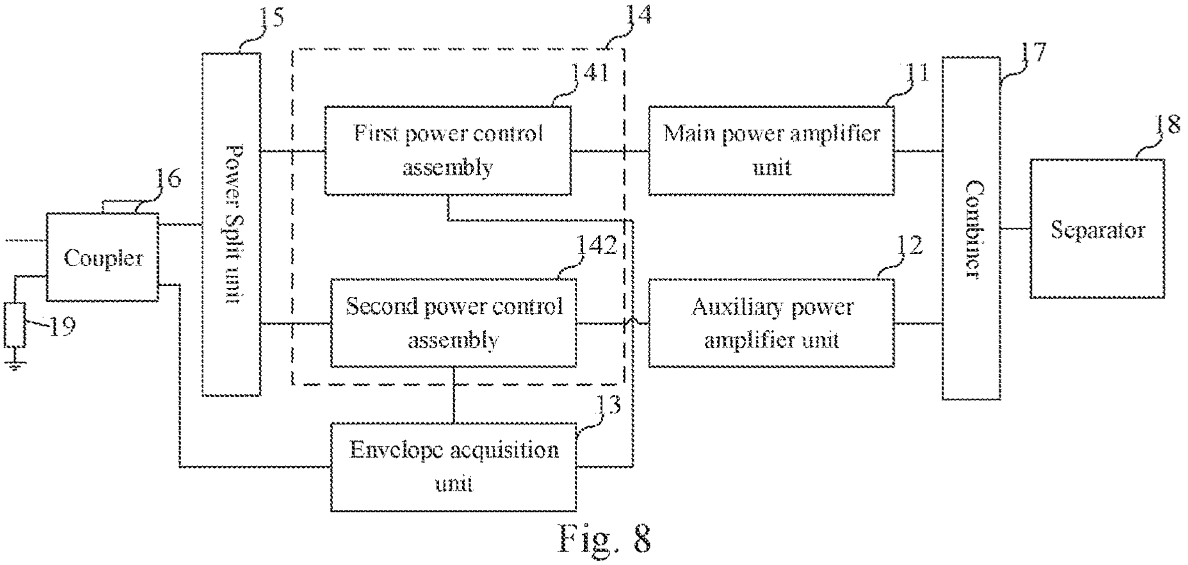
FIG. 8 is a schematic structural diagram of a power amplifier according to yet another embodiment of the present application.

In one embodiment, as shown in FIG. 8, a power amplifier includes: a main power amplifier unit 11, an auxiliary power amplifier unit 12, an envelope acquisition unit 13, a power control unit 14, a power split unit 15, a coupler 16, a combiner 17, a separator 18 and a resistance unit 19. One end of an input side of the coupler 16 is connected to the electrical signal, the other end thereof is grounded through the resistance unit 19, one end of an output side of the coupler 16 is connected to an input end of the power split unit 15, and the other end thereof is connected to an input end of the envelope acquisition unit 13. A first output end of the power split unit 15 is connected to an input end of the first power control assembly 141, an output end of the first power control assembly 141 is connected to one end of the main power amplifier unit 11, and the other end of the main power amplifier unit 11 is connected to a first input end of the combiner 17. A second output end of the power split unit 15 is connected to an input end of the second power control assembly 142, an output end of the second power control assembly 142 is connected to one end of the auxiliary power amplifier unit 12, and the other end of the auxiliary power amplifier unit 12 is connected to a second input end of the combiner 17. The output end of the combiner 17 is connected to the separator 18. A control end of the first power control assembly 141 and a control end of the second power control assembly 142 are connected to the envelope acquisition unit 13 respectively.

Optionally, if an output end of the envelope acquisition unit 13 outputs an envelop voltage of the electrical signal, the output of the first power control assembly 141 is negatively correlated with the input of the control end of the first power control assembly 141, and the output of the second power control assembly 142 is positively correlated with the input of the control end of the second power control assembly 142. If the output end of the envelope acquisition unit 13 outputs the envelop voltage of the electrical signal, the output of the first power control assembly 141 is positively correlated with the input of the control end of the first power control assembly 141, and the output of the second power control assembly 142 is negatively correlated with the input of the control end of the second power control assembly 142.

Optionally, an action speed of the first power control assembly 141 is different from an action speed of the second power control assembly 142. Specifically, the action speed of the first power control assembly 141 is smaller than the action speed of the second power control assembly 142, or the action speed of the first power control assembly 141 is greater than the action speed of the second power control assembly 142.

Optionally, the first power control assembly 141 and the second power control assembly 142 at least include a voltage variable attenuator.

Optionally, the envelope acquisition unit 13 includes an envelop tracker.

It is worth mentioning that in the embodiments of the present application, each unit may be a physical unit or a part of a physical unit, and may also be implemented in a combination of a plurality of physical units. In addition, in order to highlight the innovative parts of the present application, no unit that is not closely related to solving the technical problems proposed in the present application is introduced into the embodiments, but this does not mean that there are no other units in the embodiments.

Those ordinarily skilled in the art may understand that the above embodiments are specific embodiments for implementing the present application, and in practical applications, various changes may be made in form and details without deviating from the spirit and scope of the present application.

What is claimed is:

1. A power amplifier, comprising: a main power amplifier unit, an auxiliary power amplifier unit, an envelope acquisition unit and a power control unit; wherein an input end of the main power amplifier unit and an input end of the auxiliary power amplifier unit are connected to an electrical signal, and an output end of the main power amplifier unit is coupled to an output end of the auxiliary power amplifier unit, so as to perform power amplification on the electrical signal; and the power control unit comprises a first power control assembly, at least one the main power amplifier unit is connected to the electrical signal through the first power control assembly, and a control end of the first power control assembly is connected to the envelope acquisition unit; and/or the power control unit comprises a second power control assembly, at least one the auxiliary power amplifier unit is connected to the electrical signal through the second power control assembly, and a control end of the second power control assembly is connected to the envelope acquisition unit; wherein upon the condition that an output end of the envelope acquisition unit outputs an envelop voltage of the electrical signal, an output signal of the first power control assembly is negatively correlated with an input signal of the control end of the first power control assembly, and an output signal of the second power control assembly is positively correlated with an input signal of the control end of the second power control assembly; and upon the condition that the output end of the envelope acquisition unit outputs an inverse voltage of the envelop voltage of the electrical signal, the output signal of the first power control assembly is positively correlated with the input signal of the control end of the first power control assembly, and the output signal of the second power control assembly is negatively correlated with the input signal of the control end of the second power control assembly.

2. The power amplifier according to claim 1, wherein upon the condition that the power control unit comprises the first power control assembly and the second power control assembly, an action speed of the first power control assembly is different from an action speed of the second power control assembly.

3. The power amplifier according to claim 1, wherein the first power control assembly and the second power control assembly at least comprise a voltage variable attenuator.

4. The power amplifier according to claim 1, wherein the power control unit further comprises: a third power control assembly, at least one the main power amplifier unit is connected to the electrical signal through the first power control assembly and the third power control assembly, and a control end of the third power control assembly is connected to the envelope acquisition unit; and the power control unit further comprises: a fourth power control assembly, at least one the auxiliary power amplifier unit is connected to the electrical signal through the second power control assembly and the fourth power control assembly, and a control end of the fourth power control assembly is connected to the envelope acquisition unit.

5. The power amplifier according to claim 1, wherein the power amplifier further comprising: a power split unit;

the first power control assembly and the second power control assembly are connected to the electrical signal through the power split unit.

6. The power amplifier according to claim 5, wherein the power amplifier further comprising: a coupler;

an input end of the power split unit and an input end of the envelope acquisition unit are connected to the electrical signal through the coupler.

7. The power amplifier according to claim 1, wherein the power amplifier is applied to a communication base station, the electrical signal is a radio-frequency signal;

the power amplifier further comprising: a conversion unit;

the envelope acquisition unit is connected to an intermediate frequency signal of the communication base station through the conversion unit, wherein the radio-frequency signal is generated based on the intermediate frequency signal.

8. The power amplifier according to claim 1, wherein the envelope acquisition unit comprises an envelop tracker.

9. A communication base station, comprising the power amplifier according to claim 1.

10. The power amplifier according to claim 1, wherein the first power control assembly at least comprises a voltage variable attenuator.

11. The power amplifier according to claim 1, wherein the second power control assembly at least comprises a voltage variable attenuator.

12. The power amplifier according to claim 1, wherein the power control unit further comprises: a third power control assembly, at least one the main power amplifier unit is connected to the electrical signal through the first power control assembly and the third power control assembly, and a control end of the third power control assembly is connected to the envelope acquisition unit.

13. The power amplifier according to claim 1, wherein the power control unit further comprises: a fourth power control, at least one the auxiliary power amplifier unit is connected to the electrical signal through the second power control assembly and the fourth power control assembly, and a control end of the fourth power control assembly is connected to the envelope acquisition unit.

14. The power amplifier according to claim 1, wherein the power amplifier further comprising: a power split unit;

the first power control assembly is connected to the electrical signal through the power split unit.

15. The power amplifier according to claim 1, wherein the power amplifier further comprising: a power split unit;

the second power control assembly is connected to the electrical signal through the power split unit.

* * * * *